(12) United States Patent
Eymard

(10) Patent No.: US 10,706,346 B2
(45) Date of Patent: Jul. 7, 2020

(54) METHOD FOR MANUFACTURING A SMART CARD MODULE AND A SMART CARD

(71) Applicant: LINXENS HOLDING, Mantes la Jolie (FR)

(72) Inventor: Eric Eymard, Polignac (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 16/070,814

(22) PCT Filed: Jan. 25, 2017

(86) PCT No.: PCT/FR2017/050172
§ 371 (c)(1),
(2) Date: Jul. 18, 2018

(87) PCT Pub. No.: WO2017/129904
PCT Pub. Date: Aug. 3, 2017

(65) Prior Publication Data
US 2019/0026621 A1      Jan. 24, 2019

(30) Foreign Application Priority Data

Jan. 26, 2016 (FR) ...................................... 16 50587

(51) Int. Cl.
*G06K 19/06* (2006.01)
*G06K 19/077* (2006.01)
(Continued)

(52) U.S. Cl.
CPC . *G06K 19/07769* (2013.01); *G06K 19/07747* (2013.01); *G06K 19/07752* (2013.01);
(Continued)

(58) Field of Classification Search
CPC ............ G06K 19/07749; G07F 7/1008; G06Q 20/341
(Continued)

(56) References Cited

U.S. PATENT DOCUMENTS 6,046,504 A * 4/2000 Kimura ............... H01L 23/4951
257/668
8,727,224 B2 * 5/2014 Singleton .......... B29C 45/14647
235/488

(Continued)

FOREIGN PATENT DOCUMENTS

CN       203134786 U     8/2013
EP       0 671 705       9/1995
(Continued)

*Primary Examiner* — Ahshik Kim
(74) *Attorney, Agent, or Firm* — Harrington & Smith

(57) ABSTRACT

The invention relates to a method for producing a chip card module. According to this method, the following are produced: a module with a substrate having contacts and an electronic chip connected to at least some contacts; an antenna on a carrier, this antenna including two ends, each equipped with a connection land; a cavity in at least one layer of the card at least partially covering the carrier, in order to house the module and to expose the connection lands of the antenna; a first end of a wire is connected directly to a connection pad of the chip, and another portion is connected directly to a connection land of the antenna, after having inserted the module into the cavity.

13 Claims, 2 Drawing Sheets

(51) Int. Cl.
*H01L 23/29* (2006.01)
*H01L 23/498* (2006.01)
*H01L 23/31* (2006.01)
*H05K 1/18* (2006.01)

(52) U.S. Cl.
CPC . *G06K 19/07754* (2013.01); *G06K 19/07775* (2013.01); *H01L 23/293* (2013.01); *H01L 23/49855* (2013.01); *H01L 23/3121* (2013.01); *H05K 1/183* (2013.01)

(58) Field of Classification Search
USPC ....................................................... 235/492
See application file for complete search history.

(56) References Cited

U.S. PATENT DOCUMENTS

2015/0269476 A1\* 9/2015 Calvas ............. G06K 19/07773
 235/492
2015/0339565 A1\* 11/2015 Pueschner ......... H01L 23/49883
 235/488

FOREIGN PATENT DOCUMENTS

| EP | 3 016 032 A1 | 5/2016 |
| TW | M544072 U | 6/2017 |
| WO | WO 2004/107263 A1 | 12/2004 |
| WO | WO 2014/208532 A1 | 12/2014 |

\* cited by examiner

METHOD FOR MANUFACTURING A SMART CARD MODULE AND A SMART CARD

BACKGROUND

This patent application is a U.S. National Stage application of International Patent Application Number PCT/FR2017/050172 filed Jan. 25, 2017, and claims priority to FR 1650587 filed Jan. 26, 2016 which are hereby incorporated by reference in their entireties.

The invention relates to the field of chip cards. Chip cards are well known to the public, for which they have multiple uses: payment cards, SIM cards for cell phones, transport cards, identity cards, etc.

Chip cards comprise transmission means for transmitting data from an electronic chip (integrated circuit) to a card reader device (reading) or from this device to the card (writing). These transmission means may be "contact", "contactless" or else with a dual interface where they combine the two preceding means. The invention in particular allows the production of dual-interface chip cards. Dual-interface chip cards are called "dual" if the "contact" and "contactless" modes are managed by a single chip or "hybrid" if the "contact" and "contactless" modes are managed by two, physically separate, chips, one of the chips being connected to the contacts and the other being connected to the antenna. The invention relates to dual-interface, rather than hybrid, chip cards.

Dual-interface chip cards are generally composed of a rigid carrier made of a plastic material of PVC, PVC/ABS, PET or polycarbonate type forming the body of the card, in which separately produced electronic module and antenna are incorporated. The electronic module comprises a generally flexible printed circuit board that is equipped with an electronic chip and contact lands that are electrically connected to connection pads of the chip. The contact lands are flush with the electronic module, on the carrier surface forming the card, for a connection by electrical contact with a card reader device. Dual-interface chip cards furthermore comprise at least one antenna for transmitting data between the chip and a radiofrequency system that allows contactless reading or writing of data.

In the prior art, the electronic module comprising contacts and the chip, on the one hand, and the antenna potentially integrated into a carrier (inlay), on the other hand, are generally produced separately, after which the antenna is connected to the module. The antenna is connected to the module using complex methods which have a negative impact on productivity, production yields and the reliability of the cards once in use.

SUMMARY

An aim of the invention is to simplify this type of method and to make it more reliable.

This aim is at least partly achieved by virtue of a method for producing a chip card module, in which:
  a substrate having a first main face and a second main face is provided, with contacts for making a temporary electrical connection with a contact card reader device on the first face of the substrate;
  an electronic chip is attached to the substrate;
  a first end of at least one wire is connected directly to a connection pad of the chip ("directly" means that there is no other conductor, intermediate conductor or connection land, between the first end of the wire and the connection pad of the chip); and
  the chip and the first end of the wire are encapsulated in a resin, but a second end of the wire is left outside the resin.

By virtue of these arrangements, and in particular owing to the end (referred to as the "second end" above) of the connection wires between the chip and the antenna not being encapsulated after production of the module, it is possible to use it to make a direct (i.e. without any other conductor, intermediate conductor or connection land) connection with a connection land of the antenna. The method according to the invention affords a simplification with respect to the methods of the prior art in which the second end of the wire is attached to a conductive track on the front face (also referred to as the "contact face") or on the back face (also referred to as the "bonding face"), and in which this conductive track must itself be connected, for example by soldering and/or with the aid of another wire, to connection lands of the antenna.

This method for producing a chip card module potentially comprises any one of the following features, considered independently of the others or in combination with one or more of the others:
  it comprises a step in which the second end of the wire is fixed to a transfer pad through a connection well previously made through the substrate, this arrangement allowing the second end of the wire to be held until it may be held in another manner (for example using a layer of a hot-melt material as mentioned below);
  it comprises a step in which a cut is made around a chip connected to the first end of a wire, this cut delimiting a module and defining the final dimensions of the singulated module, and the connection well, in which the second end of the wire is fixed, being located outside the module after cutting; thus, the connection well, which corresponds in this case to a temporary structure, is no longer visible on the finished product;
  it comprises a step in which a hot-melt material is applied to the second face of the substrate, such that one portion of the wire is accessible and another portion is held between the substrate and the hot-melt material; for example, a window is made in the hot-melt material, leaving the wire accessible through the window; and
  it comprises a step in which the module is singulated by dicing it according to its final dimensions (i.e. the dimensions of the module when it is housed in a card), the portion of the wire that is left accessible is then located on the singulated module.

According to another aspect, the invention relates to a method for producing a chip card. This method comprises:
  the production of a module comprising a substrate having a first main face and a second main face, with contacts for making a temporary electrical connection with a contact card reader device on the first face of the substrate, and comprising an electronic chip attached to the substrate;
  the production of an antenna on a carrier, this antenna comprising two ends, each equipped with a connection land;
  the production of a cavity in at least one layer of the card at least partially covering the carrier, this cavity being intended to house the module and to expose the connection lands of the antenna;
  the direct connection of a first end of at least one wire to a connection pad of the chip; and the direct connection of a portion of this wire to a connection land of the antenna, potentially after having inserted the module into the cavity.

This method for producing a chip card potentially comprises any one of the following features, considered independently of the others or in combination with one or more of the others:

the first end of the wire is encapsulated in an encapsulation resin;

a portion of the wire is held, outside the encapsulation resin, at least partially on the substrate using a hot-melt material;

a portion of a wire connected to the chip is soldered to a connection land of the antenna by applying a thermode to a contact located on the first face (contact face) of the substrate.

According to another aspect, the invention relates to a chip card module. This chip card module comprises:

a substrate having a first main face and a second main face, with contacts for making a temporary electrical connection with a contact card reader device on the first face of the substrate;

an electronic chip fixed to the substrate;

at least one wire connected, by a first end, to a connection pad of the chip, the chip and the first end of the wire being encapsulated in a resin.

In this chip card module, a portion of the wire extends out of the resin.

Potentially, this chip card module additionally comprises a layer of hot-melt material applied to the second face of the substrate, while leaving at least one portion of the wire uncovered by the hot-melt material.

BRIEF DESCRIPTION OF THE DRAWINGS

According to another aspect, the invention relates to a chip card comprising a module with a chip, and an antenna. This chip card additionally comprises at least one wire having a first end connected directly to a connection pad of the chip and a portion connected directly to a connection land of the antenna. Potentially, the first end of the wire is encapsulated, with the chip, in a resin and the portion outside the encapsulation resin is soldered, through an opening made in a hot-melt sheet, to a connection land of the antenna.

Other features and advantages of the invention will become apparent upon reading the detailed description and the appended drawings in which.

DETAILED DESCRIPTION OF EMBODIMENTS

Figure 1:
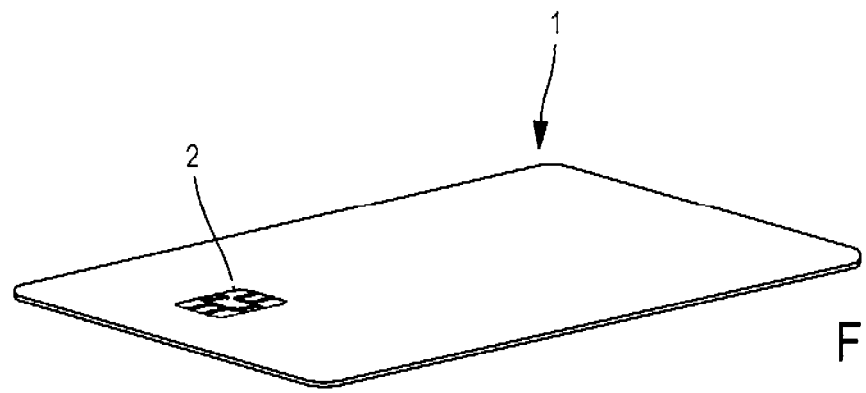
FIG. 1 is a schematic representation, in perspective view, of a chip card according to the invention.

As shown in FIG. 1, a chip card 1 comprises a module 2. The chip card 1 is composed of multiple layers 3, 4, 5 laminated on top of one another.

Figure 2:
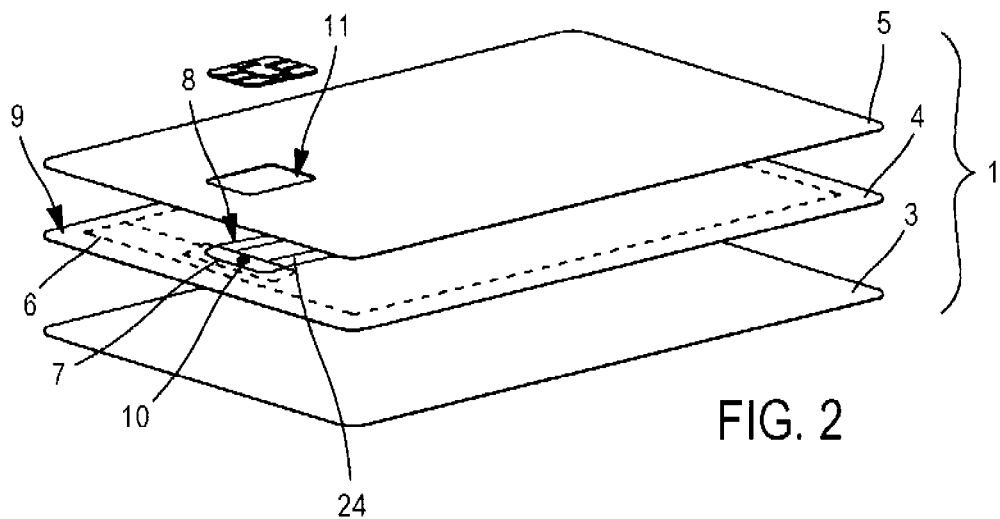
FIG. 2 is a schematic representation, in exploded perspective view, of the chip card of FIG. 1.

For example, the chip card shown in FIG. 2 comprises a bottom finishing layer 3, an antenna carrier (inlay) 4 an a top finishing layer 5.

The bottom 3 and top 5 finishing layers may be, for example, printed layers of PVC.

The antenna carrier 4 is itself generally composed, in a known manner, of multiple layers between which a wire antenna or an antenna etched into a metal sheet is integrated (in FIG. 2, the antenna 6 inserted between two layers is represented by dotted lines). The various layers forming the antenna carrier 4 are, for example, also made of PVC.

The antenna 6 comprises, for example, a conductive line wound into several loops extending to the periphery of the card 1. Each of the two ends of the line is connected to a connection land 7. The connection lands 7 are at least partly visible and accessible at an opening 8 made in a top layer 9 of the antenna carrier 4. The connection lands 7 comprise, for example, solder pads 10. The solder pads 10 are composed of a material having a melting point of between 120° C. and 230° C., and more preferably between 160° C. and 190° C.

During the implementation of the method for producing the chip card 1, the bottom 3, top 5 finishing layers and the antenna carrier 4 are laminated together, then a cavity 11 is milled into the top finishing layer 5 in order to house a module 2 therein and to expose the connection lands 7 of the antenna 6, each equipped with a respective solder pad 10.

Figure 3:
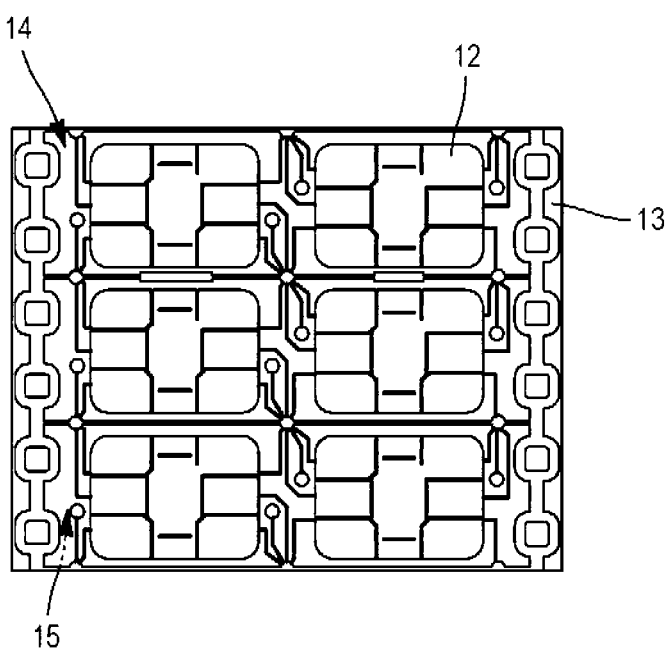
FIG. 3 is a schematic representation, seen from above and from the front, of a portion of a substrate strip for the production of chip card modules such as that of FIGS. 1 and 2.

Furthermore, the method for producing the module 2 comprises the production of metal contacts 12 on a flexible substrate 13 (see FIG. 3). The substrate 13 comprises a first main face 14 and a second main face 15, with the contacts 12 on the first face 14 of the substrate 13 (front face or contact face).

These contacts 12 are made, for example, in a known manner by etching a metal sheet (e.g. copper alloy) borne by a dielectric substrate (e.g. epoxy glass) or by cutting out metal patterns and transferring these patterns onto a dielectric substrate (lead frame technology).

Figure 4:
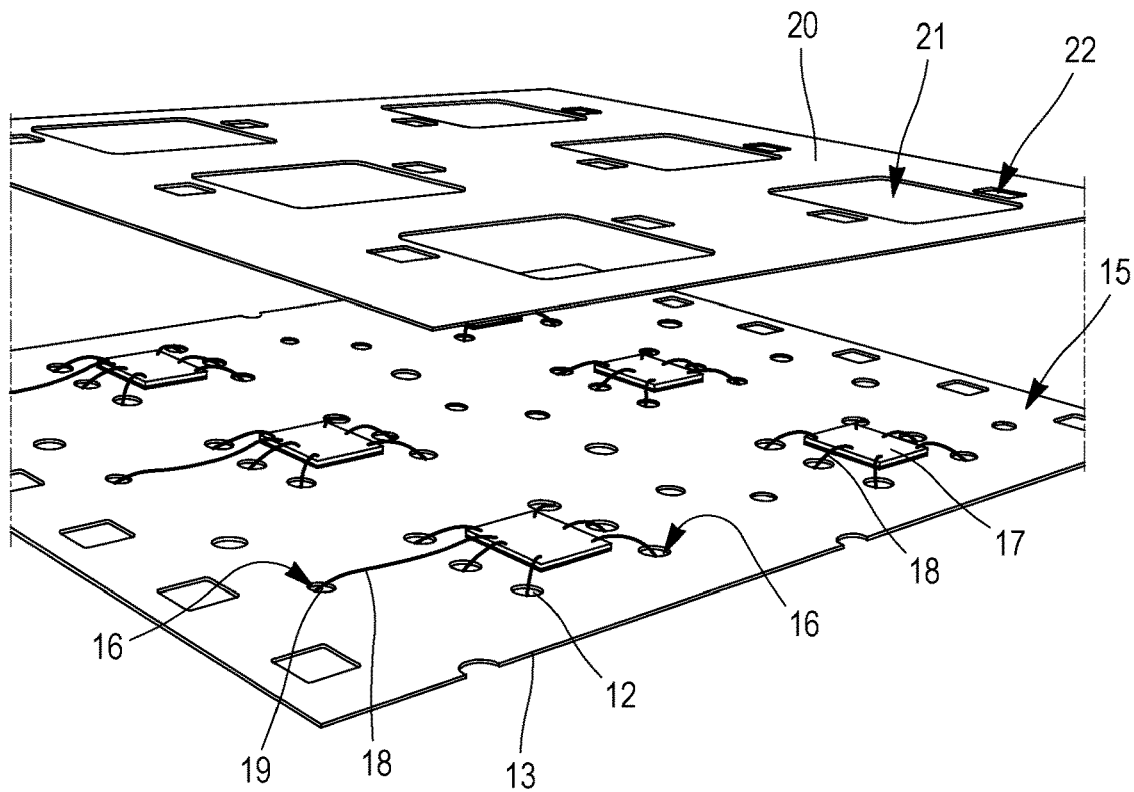
FIG. 4 is a schematic representation, in exploded perspective view, of the substrate strip of FIG. 3 seen from the back face.

As shown in FIG. 4, the substrate 13 is perforated in order to produce connection wells 16, the bottom of which is closed off by the contacts 12. Chips 17 (one per module) are bonded to the back face 15 of the substrate 13 (bonding face). Each chip 17 is connected using conductive wires 18 that connect, through the connection wells 16, contacts 12 to connection pads of the chip 17.

Additionally, two connection pads of the chip are each connected, also by wires 18 passing through connection wells 16, to a respective transfer pad 19. Each transfer pad 19 is produced in a manner akin to the contacts 12 and simultaneously with the latter. The connection wires 18 for connecting the chip 17 to the antenna 6 are therefore each connected to the chip 17 by a first end and to a transfer pad 19 by a second end.

Figure 5:
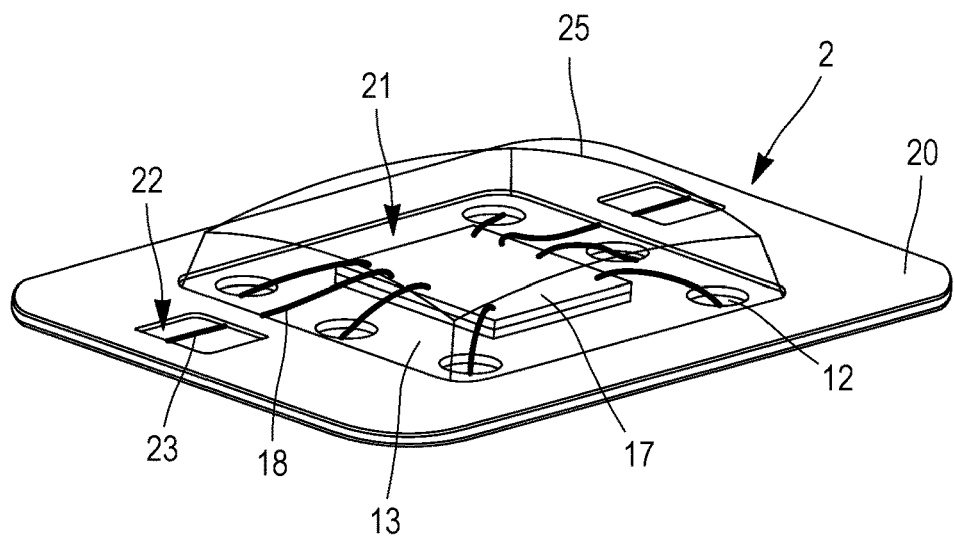
FIG. 5 is a schematic representation, in perspective view, of a chip card module such as that of FIGS. 1 and 2.

A layer of hot-melt material 20 in which openings 21, 22 are made is subsequently applied to the back face 15 of the substrate 13. This layer of hot-melt material 20 allows the module 2 to be fixed into its cavity 11 which is milled into the card 1. The openings 21, 22 are two types: large openings 21 in which the chips 17 and the connection wires 18 for connecting the chip 17 to the contacts 12 are placed, and smaller windows 22, through each of which a connection wire 18 for connecting the chip 17 to the antenna 6 remains visible and accessible. A portion 23 of the wire 18 for connecting the chip 17 to the antenna 6 passes through each of these windows 22 (see FIG. 5). This portion 23 of the wire 18 is held on two opposite sides of each window 22, between the hot-melt material 20 and the substrate 13. The portion 23 of the wire 18 passing through each window 22 is relatively free. It is stretched over the surface of the substrate 13 without adhering thereto.

An encapsulation resin 25 covers the chip 17 and the wires 18 for connecting the chip 17 to the contacts 12. The glob of encapsulation resin 25 is confined by the edge of the large openings 21. The windows 22, through which a portion 23 of the wires 18 for connecting the chip 17 to the antenna 6 pass, are without resin 25.

On the finished and singulated module 2, the layer of hot-melt material 20 forms a frame around the entirety of the chip 17. Only two windows 23 are cut out from this frame. The dimensions of these windows 23 are relatively small (for example 1 mm×2 mm). Thus, the presence of these windows 23 has practically no impact on the adhesion of the module 2 to the edges 24 made when milling the cavity 11 into the card 1 (see FIG. 2).

After cutting the module 2 thus singulated into its final dimensions, the transfer wells 19, to which the second ends of the wires 18 for connecting the chip 17 to the antenna 6 were connected, have been removed.

The module 2 is subsequently inserted into a cavity 11 milled into a chip card 1. The windows 23 through which the wires 18 for connecting the chip 17 to the antenna 6 pass are placed facing the connection lands 7 of the antenna 6, which are left visible in the cavity 11.

A thermode (not shown) is applied to the contact face 14 of the module 2. The heat provided by the thermode reactivates the hot-melt material 20 located on the back face 15 of the module 2. The hot-melt material 20 adheres to the edges 24 created in the cavity 11 during the milling thereof. Furthermore, the thermode melts the solder pads 10 placed on the connection lands 7 of the antenna 6. The thermode is, for example, heated to a temperature of between 120° C. and 250° C. The conduction of heat between the thermode and the solder pad 10 is particularly efficient when it passes only through the contacts 12, which are good conductors of heat, and the substrate 13.

The melted solder of the solder pads 10 comes into contact with the portion 23 of the wire 18 passing through each window 22. The portion 23 of the wire 18 thus partly coated with solder is then electrically connected to the antenna 6. Additionally, as the solder does not adhere to the substrate 13 or to the hot-melt material 20, the portion 23 of the wire 18 held in the solder is rigidly fixed to the connection pads 7 of the antenna 6 but retains relative freedom of movement with respect to the module 2. This relative freedom of movement and the stretch properties of the wire 18 make it possible to compensate for the movements of the module 2 with respect to the rest of the body of the card 1 and to absorb the stresses generated between them when the latter is in use, allowing the accidental disconnections of the antenna 6 that are sometimes observed in the cards of the prior art to be avoided.

The invention claimed is:

1. A method for producing a chip card module comprising:
    a step where a substrate having a first main face and a second main face is provided, with, on the first main face of the substrate, contacts for making a temporary electrical connection with a contact card reader device;
    a step where an electronic chip is attached to the substrate;
    a step where a first end of at least one wire is connected directly to a connection pad of the chip, and the chip and the first end of the at least one wire are encapsulated in a resin, characterized in that a second end of the at least one wire is left outside the resin for a direct connection with at least one antenna pad located on a carrier which is different from the substrate.

2. The method according to claim 1, comprising a step in which the second end of the at least one wire is fixed to a transfer pad through a connection well previously made through the substrate.

3. The method according to claim 2, in which a cut is made around the chip connected to the first end of at least one wire, the cut delimiting the chip card module and defining final dimensions of the chip card module as a singulated module, and the connection well, in which the second end of the at least one wire is fixed, being located outside the chip card module after cutting.

4. The method according to claim 1, comprising a step in which a hot-melt material is applied to the second main face of the substrate, such that one portion of the at least one wire is accessible and another portion is held between the substrate and the hot-melt material.

5. The method according to claim 4, in which the hot-melt material, in which a window has been made, is applied to the second face of the substrate, leaving the at least one wire accessible through the window.

6. The method according to claim 4, comprising a step in which the module is singulated by dicing the module according to final dimensions, the portion of the at least one wire that is left accessible is then located on the singulated module.

7. A method for producing a chip card comprising:
    production of a module comprising a substrate having a first main face and a second main face, with, on the first main face of the substrate, contacts for making a temporary electrical connection with a contact card reader device, and comprising an electronic chip attached to the substrate;
    production of an antenna on a carrier which is different from the substrate, this antenna comprising two ends, each equipped with a connection land;
    production of a cavity in at least one layer of the card at least partially covering the carrier, in order to house the module and to expose the connection lands of the antenna;
    direct connection of a first end of at least one wire to a connection pad of the chip,
    characterised in that a portion of the at least one wire is connected directly to at least one of the connection lands of the antenna.

8. The method according to claim 7, in which the first end of the at least one wire is encapsulated in an encapsulation resin.

9. The method according to claim 8, in which a portion of the at least one wire is held, outside the encapsulation resin, at least partially on the substrate using a hot-melt material.

10. The method according to claim 7, in which the portion of the at least one wire is soldered to at least one of the connection lands of the antenna by applying a thermode to a contact located on the first main face of the substrate.

11. A chip card module comprising:
    a substrate having a first main face and a second main face, with, on the first main face of the substrate, contacts for making a temporary electrical connection with a contact card reader device;
    an electronic chip fixed to the substrate;
    at least one wire connected, by a first end, to a connection pad of the chip,
    in which the chip and the first end of the at least one wire are encapsulated in a resin, characterized in that a portion of the at least one wire extends out of the resin for a direct connection with an antenna pad located on a carrier which is different from the substrate.

12. The chip card module according to claim 11, comprising a layer of hot-melt material, applied to the second main face of the substrate, having at least one portion of the at least one wire uncovered by the hot-melt material.

13. A chip card comprising a module with a substrate and a chip on the substrate, and an antenna, characterized in that the chip card comprises at least one wire having a first end connected directly to a connection pad of the chip and a portion connected directly to a connection land of the antenna, where the antenna is located on a carrier which is different from the substrate, in which the first end of the at least one wire is encapsulated, with the chip, in a resin and a portion of the at least one wire outside the encapsulation resin is soldered, through an opening made in a hot-melt sheet, to the connection land of the antenna.

* * * * *